United States Patent [19]

Baskett

[11] Patent Number: 4,760,249

[45] Date of Patent: Jul. 26, 1988

[54] LOGIC ARRAY HAVING MULTIPLE OPTICAL LOGIC INPUTS

[75] Inventor: Ira E. Baskett, Tempe, Ariz.

[73] Assignee: Motorola, Inc., Schaumburg, Ill.

[21] Appl. No.: 945,151

[22] Filed: Dec. 22, 1986

[51] Int. Cl.[4] .................................................. G01R 1/04
[52] U.S. Cl. ............................. 250/213 A; 324/158 D
[58] Field of Search ............... 250/213 A; 324/73 PC, 324/73 R, 158 R, 158 D; 364/713, 822; 365/112, 215

[56] References Cited

U.S. PATENT DOCUMENTS

| | | | |
|---|---|---|---|
| 3,222,528 | 12/1965 | Thorpe | 250/213 A |
| 3,702,465 | 11/1972 | Cricchi | 340/173 T |
| 3,801,910 | 4/1974 | Quinn | 324/158 D |
| 4,238,839 | 12/1980 | Redfern et al. | 365/96 |
| 4,368,946 | 1/1983 | Kaneko et al. | 350/3.78 |
| 4,504,846 | 3/1985 | Chappell et al. | 357/12 |
| 4,510,575 | 4/1985 | Mueller | 364/518 |
| 4,520,387 | 5/1985 | Cortellini | 358/90 |
| 4,550,395 | 10/1985 | Carlson | 369/103 |
| 4,575,820 | 3/1986 | Barditch | 365/114 |
| 4,689,793 | 8/1987 | Liu et al. | 250/213 A |

OTHER PUBLICATIONS

"Read-Only Memory Fabrication by Laser Formed Connections," Cook et al., IBM Tech. Disc. Bull., vol. 15, No. 8, Jan. 1973, pp. 2371-2372.

Primary Examiner—David C. Nelms
Assistant Examiner—Stephone B. Allen
Attorney, Agent, or Firm—William E. Koch

[57] ABSTRACT

A monolithically integrated logic circuit is provided that is programmed by an optical input. A plurality of input/output pads are provided on a semiconductor substrate having a planar surface. A plurality of semiconductor devices and a plurality of light sensitive devices are formed with selected patterns in the surface. At least one metallic layer is formed on the substrate for coupling selected ones of the semiconductor devices, light sensitive devices, and input/output pads for forming a logic circuit, wherein an output of the logic circuit is determined by programming selected ones of the plurality of light sensitive devices by applying light thereto.

12 Claims, 2 Drawing Sheets

LOGIC ARRAY HAVING MULTIPLE OPTICAL LOGIC INPUTS

FIELD OF THE INVENTION

This invention relates generally to logic circuits and gate arrays, and more specifically, to monolithically integrated logic that is programmed by an optical input.

BACKGROUND OF THE INVENTION

Large Scale Integration (LSI) construction of complex digital logic interconnected to provide a complete system on a single integrated circuit chip has greatly reduced space limitations on the chip by allowing for higher density of the semiconductor devices. Since only a relatively small number of different logical functions are required to provide a variety of complex subsystems, identical sections of the integrated circuit containing a plurality of each of several basic logic circuits can be fabricated into different subsystems as determined by the circuit interconnections. The semiconductor devices are formed by conventional procedures and may be arranged in an array of standard cells. The devices of each cell may be interconnected to form one or more different types of logic circuits, and the logic circuits may be interconnected to form the desired system.

In the manufacture of digital logic systems in this manner, standard cells are typically provided which may be customized by forming metal interconnections by conventional means to interconnect the devices of selected cells to provide the basic logic circuit for the system. High density packing of logic arrays offer both a large reduction in system component count and power dissipation. However, previously known logic circuits and arrays have drawbacks in that the metallization used for interconnection of the semiconductor devices and for supplying the power thereto limits the complexity of the integrated circuit due to the space required by the metal. The large plurality of semiconductor devices in the logic circuit have created a need for a complex weaving of the current carrying paths within the metallization layers that overlie the devices for connecting one device to another.

Furthermore, for custom circuits, the time typically required to complete the manufacture of the chip after circuit design (metallization, packaging, etc.) is several weeks.

Thus, what is needed is a logic circuit wherein the metallization required for interconnection of semiconductor devices is reduced and wherein the manufacture of the chip may be completed prior to circuit design.

SUMMARY OF THE INVENTION

Accordingly, it is an object of the present invention to provide an improved logic circuit. Another object of the present invention is to provide a logic circuit having increased density.

Yet another object of the present invention is to provide a logic circuit having reduced metallization for signal routing and control lines.

Still another object of the present invention is to provide a logic circuit that may be reprogrammed while in use.

Another object of the present invention is to provide a logic circuit wherein metallization required for power busses and signal lines is substantially reduced.

Yet another object of the present invention is to provide a logic circuit for storing computer microcode, lookup tables, or other control information in a hologram or other nonvolatile media.

Still another object of the present invention is to provide a logic circuit that may be programmed after manufacture.

In carrying out the above and other objects of the invention in one form, there is provided a monolithically integrated logic circuit that is programed by an optical input. A plurality of input/output pads are provided on a semiconductor substrate having a planar surface. A plurality of semiconductor devices and a plurality of light sensitive devices are formed with selected patterns in the surface. At least one metallic layer is formed on the substrate for coupling selected ones of the semiconductor devices, light sensitive devices, and input/output pads for forming a logic circuit, wherein an output of the logic circuit is determined by programming selected ones of the plurality of light sensitive devices by applying light thereto.

The above and other objects, features, and advantages of the present invention will be better understood from the following detailed description taken in conjunction with the accompanying drawings.

DETAILED DESCRIPTION OF THE INVENTION

Figure 1:
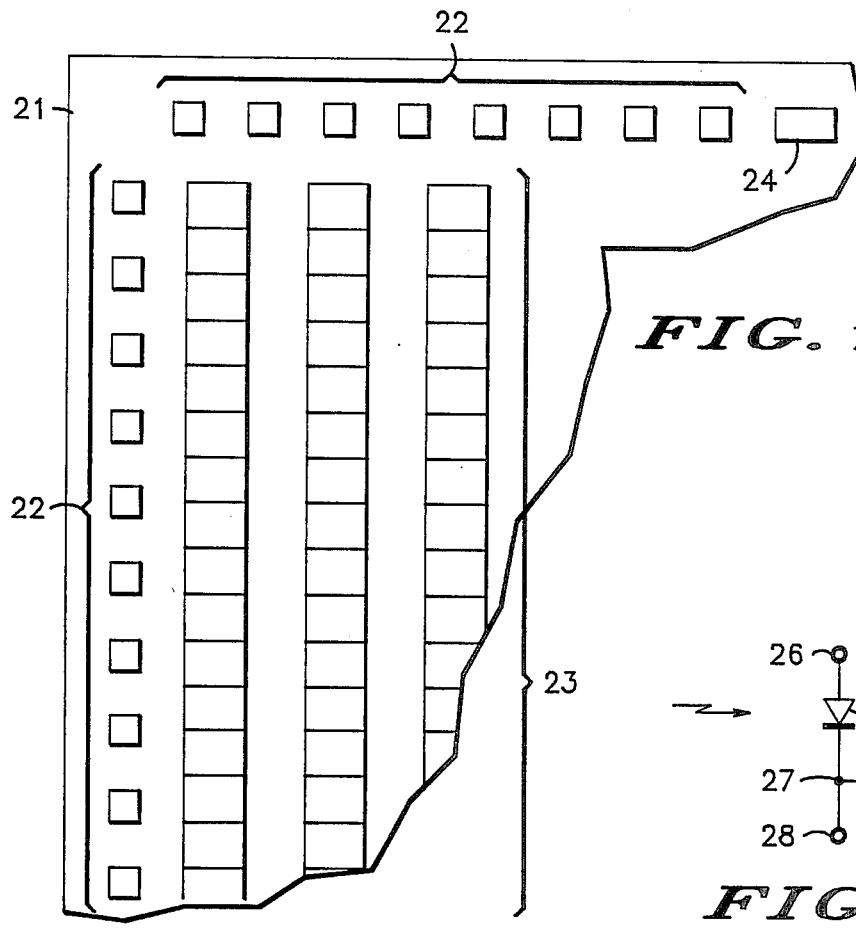
FIG. 1 is a top view of a logic array.

Referring to FIG. 1, an integrated circuit chip 21 is shown having input/output pads 22 and cells 23. The invention described hereinafter applies especially well to logic arrays, but would also apply to more simple logic circuits where each cell 23 may represent simply a semiconductor device such as a transistor or resistor. In the case of the logic array, each cell 23 comprises a plurality of semiconductor devices. Each device on the integrated circuit that is to be included in the designed logic array is interconnected to other devices and selected input/output pads 22 by metal (not shown) routed over the devices. Each cell 23 and selected devices are also connected to power pad 24 by metal (not shown), although in one specific embodiment, power pad 24 may be eliminated entirely.

Figure 2:
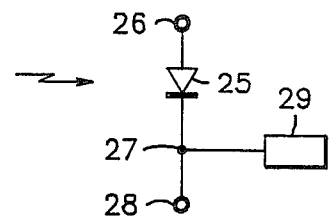
FIG. 2 is a partial block diagram of a first embodiment of the present invention.
Figure 3:
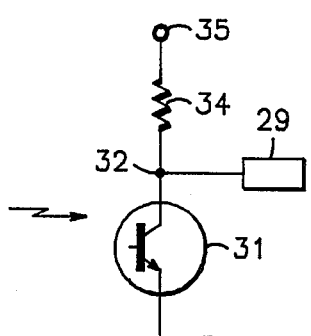
FIG. 3 is a partial block diagram of a second embodiment of the present invention.

The circuits illustrated in FIGS. 2 and 3 are only two of the many ways that would easily be designed by those skilled in the art to drive logic element 29 by a radiation sensitive device. "Radiation" as used in describing this invention includes electron beams and electromagnetic waves of any frequency such as light infrared, ultraviolet, gamma rays, X-rays, etc. For simplicity, the remaining discussion will be directed to devices sensitive to that portion of the radiation spectrum commonly referred to as light; however, the invention is not to be construed as limited thereto. Any one of these circuits, as shown in FIGS. 2 and 3, would be placed in any or all of cells 23 of FIG. 1. Referring to FIG. 2, light sensitive diode 25 is coupled between voltage terminal 26 and node 27. Node 27 is further connected to voltage terminal 28 and logic element 29. When there is no light applied to diode 25, node 27 and the input to logic element 29 is at the lower voltage of terminal 28. When light is applied to diode 25, the higher voltage on terminal 26 is applied to node 27 and the input to logic element 29.

Referring to FIG. 3, light sensitive transistor 31 is coupled between node 32 and voltage terminal 33 and resistor 34 is coupled between voltage terminal 35 and node 32. Logic element 29 is connected to node 32. When no light is applied to transistor 31, node 32 and the input to logic element 29 receive the higher voltage on terminal 35. When light is applied to transistor 31, it becomes conductive and pulls node 32 and the input to logic element 29 down to the lower voltage on terminal 33.

Figure 4:
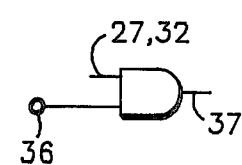
FIG. 4 is a schematic of one type of logic function that may be used in the present invention.
Figure 5:
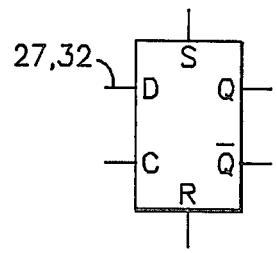
FIG. 5 is a schematic of another type of logic function that may be used in the present invention.

FIGS. 4 and 5 illustrate typical logic gates that may comprise logic element 29. FIG. 4 is an AND gate having a first input connected to node 27 or 32, a second input coupled to reference terminal 36, and an output 37. FIG. 5 is a D type flip-flop having a data input D connected to node 27 or 32, a clock input C, a set input S, a reset input R, and outputs Q and $\bar{Q}$. These logic gates function in a manner well known to those skilled in the art.

Figure 6:
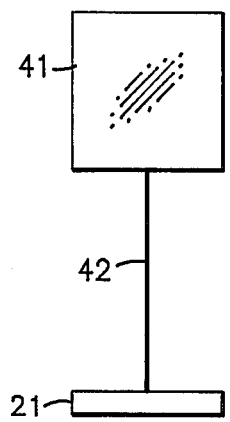
FIG. 6 is a block diagram of a first method of implementing the present invention.
Figure 7:
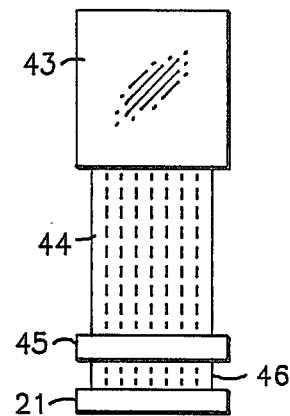
FIG. 7 is a block diagram of a second method of implementing the present invention.
Figure 8:
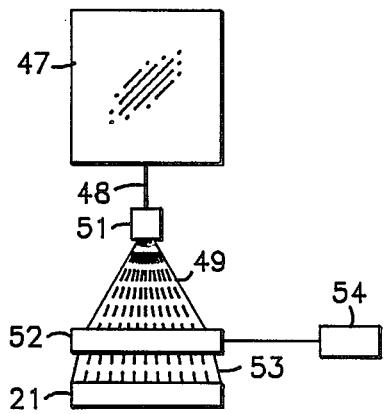
FIG. 8 is a block diagram of a third method of implementing the present invention.

Light may be applied to light sensitive devices 25 or 31 within cells 23 by one of several methods, for instance, as shown in FIGS. 6, 7 and 8. Integrated circuit 21 may be programmed by one of these methods either before packaging and after packaging is completed. It may be desirable to place a window comprising quartz or some similar material on top of the chip for ensuring the transmission of the light through to the light sensitive devices.

Referring to FIG. 6, programmable light source 41 directs, for instance, a movable light beam 42 onto integrated circuit 21 so as to strike selected light sensitive devices within integrated circuit 21. Programmable light source 41 may, for instance, be a cathode ray tube, that sweeps a beam across integrated circuit 21. The coherent beam of light in this or any other method may be transmitted through a fibre optics medium. In FIG. 7, light source 43 generates, for instance, a wide beam of light 44 that partially passes through pattern 45, thereby providing a coded wide beam of light that selectively applies light 46 to integrated circuit 21 so as to activate light sensitive devices therein.

Yet another method is illustrated in FIG. 8, wherein coherent light source 47 emits, for instance, a coherent beam of light 48 which is expanded into a cone of light 49 by expanding lens 51. Light 49 impinges upon holographic plate 52, providing light 53 to integrated circuit 21. The holographic pattern contained on plate 52 has been imprinted thereupon in a manner well known to those skilled in the art. The desired pattern on plate 52 is determined by computer for the desired logic output of integrated circuit 21. Alternatively, many patterns may be imprinted on plate 52, one for each separate desired logic design. The desired pattern or logic design may be applied to integrated circuit 21 rotating plate 52 by applying torque from rotating means 54.

Integrated circuit 21 may be programmed in this manner in either of two ways. First, the programming may be accomplished and the output received while the light is applied to the circuit. Second, the programming may be accomplished using flip-flops or memory devices as shown in FIG. 5, and the output taken long after the light has been removed.

Figure 9:
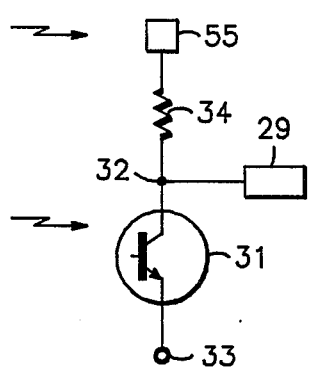
FIG. 9 is a partial block diagram of a third embodiment of the present invention.
Figure 10:
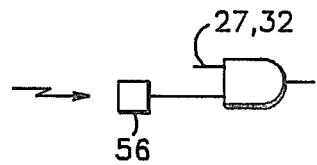
FIG. 10 is a partial block diagram of a fourth embodiment of the present invention.

An additional advantage of the present invention is that light sensitive devices may also be used to supply voltage at various or all places on the integrated circuit. For example, referring to FIG. 9, light sensitive device 55 replaces voltage terminal 35 of FIG. 3. Alternatively, light sensitive device 55 may supply a voltage directly to logic element 29 so that logic element 29 is activated when light is applied. Light sensitive device 55 supplies a supply voltage across resistor 34 to node 32 when light impinges upon device 55 for driving logic element 29. Referring to FIG. 10, light sensitive device 56 supplies a reference voltage to the AND gate illustrated in FIG. 4.

By now it should be appreciated that there has been provided monolithically integrated logic that is programmed by a radiation input after manufacture that both substantially increases density and eliminates manufacturing delays after circuit design.

I claim:
1. A monolithically integrated logic array comprising:
   a semiconductor substrate having a planar surface;
   a plurality of input/output pads provided on said surface;
   a plurality of semiconductor devices formed with selected patterns in said surface;
   a plurality of electromagnetic sensitive devices formed with selected patterns in said surface; and
   at least one metallic layer formed on said substrate, said at least one metallic layer coupling selected ones of said semiconductor devices, electromagnetic sensitive devices, and input/output pads for forming said logic array, wherein at least one output signal at one of said input/output pads is at least partially determined by programming selected ones of said plurality of electromagnetic sensitive devices by applying electromagnetic waves thereto.

2. The circuit according to claim 1 wherein said plurality of semiconductor devices comprise a plurality of flip-flops, each of said flip-flops coupled to one of said electromagnetic sensitive devices, wherein said circuit will remain programmed after said electromagnetic waves have been removed.

3. The circuit according to claim 1 further comprising at least one electromagnetic voltage device coupled to at least one of said electromagnetic sensitive devices for providing a supply voltage thereto.

4. The circuit according to claim 1 further comprising at least one electromagnetic voltage device coupled to at least one of said electromagnetic sensitive devices for providing a reference voltage thereto.

5. The circuit according to claim 1 wherein said plurality of semiconductor devices comprise a logic gate and at least one of said electromagnetic sensitive devices is a diode having an anode coupled to a first voltage and a cathode coupled to a second voltage, said logic gate coupled to one of said anode and said cathode.

6. The circuit according to claim 1 wherein said plurality of semiconductor devices comprise a logic gate and at least one of said electromagnetic sensitive devices is a transistor having a first current carrying electrode coupled to said logic gate and a second current carrying electrode coupled to a first voltage, and further comprising a resistor coupled between said logic gate and a second voltage.

7. A monolithically integrated logic array comprising:
   a plurality of logic gates, each of said logic gates having an input for receiving a digital input and an output for providing a digital output;
   first means for providing a first voltage;
   second means for providing a second voltage;
   a plurality of third means, each of said third means coupled between said first and second means and coupled to one of said plurality of logic gates for providing said digital input to said logic gate in response to an electromagnetic input.

8. The monolithically integrated logic array according to claim 7 wherein each one of said third means comprises an electromagnetic sensitive diode having an anode coupled to said first means and a cathode coupled to said second means and said logic gate.

9. The monolithically integrated logic circuit according to claim 7 wherein each one of said third means comprises:
   a resistor coupled between said first means and said logic gate; and
   an electromagnetic sensitive transistor coupled between said logic gate and said second means.

10. The monolithically integrated logic circuit according to claim 7 further comprising a plurality of fourth means, each of said fourth means coupled between one of said third means and said logic gate for latching said input signal.

11. The monolithically integrated logic circuit according to claim 7 wherein said first means comprises an electromagnetic sensitive device.

12. A gate array including a plurality of logic gates on an integrated circuit, a plurality of input/output pins, at least one metallization layer formed on said integrated circuit and coupling selected ones of said logic gates and input/output pads for forming a logic circuit, said gate array comprising:
   a plurality of electromagnetic sensitive devices formed on said integrated circuit, coupled to said logic gates by said metallization layer, wherein an output of said logic circuit is determined by programming selected ones of said plurality of electromagnetic sensitive devices by applying electromagnetic waves thereto.

* * * * *